United States Patent
Wu

(10) Patent No.: US 12,352,658 B2
(45) Date of Patent: Jul. 8, 2025

(54) SENSING CIRCUIT WITH ELECTROMAGNETIC INTERFERENCE PROTECTION FUNCTION

(71) Applicants: INVENTEC (PUDONG) TECHNOLOGY CORPORATION, Shanghai (CN); INVENTEC CORPORATION, Taipei (TW)

(72) Inventor: Yaofeng Wu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 298 days.

(21) Appl. No.: 18/210,495

(22) Filed: Jun. 15, 2023

(65) Prior Publication Data
US 2024/0402033 A1    Dec. 5, 2024

(30) Foreign Application Priority Data

Jun. 2, 2023   (CN) .......................... 202310648788.6

(51) Int. Cl.
G01M 3/16    (2006.01)

(52) U.S. Cl.
CPC .................. *G01M 3/165* (2013.01)

(58) Field of Classification Search
CPC .................................................... G01M 3/165
See application file for complete search history.

(56) References Cited

U.S. PATENT DOCUMENTS

| | | | | |
|---|---|---|---|---|
| 5,202,667 A | * | 4/1993 | Alvin | G08B 21/20 340/605 |
| 11,808,790 B2 | * | 11/2023 | Hurwitz | G01R 15/181 |
| 2003/0091253 A1 | * | 5/2003 | Morita | F16C 33/723 384/448 |
| 2023/0003768 A1 | * | 1/2023 | Hurwitz | G01R 15/205 |

* cited by examiner

*Primary Examiner* — Alexander A Mercado
(74) *Attorney, Agent, or Firm* — Maschoff Brennan

(57) ABSTRACT

A sensing circuit with electromagnetic interference protection function comprises a computing element and a sensing module. The computing element has a first terminal and a second terminal, and is configured to output a sensing result according to a voltage difference between the first terminal and the second terminal. The sensing module has a first connection point, a second connection point, a third connection point and a fourth connection point. The first connection point is electrically connected to the first terminal, the second connection point is electrically connected to the second terminal and grounded through a first circuit, the third connection point is electrically connected to the first connection point and is configured to receive an electrical signal, and the fourth connection point is electrically connected to the second connection point and grounded through a second circuit, wherein the first circuit is the same as the second circuit.

8 Claims, 3 Drawing Sheets

SENSING CIRCUIT WITH ELECTROMAGNETIC INTERFERENCE PROTECTION FUNCTION

CROSS-REFERENCE TO RELATED APPLICATIONS

This non-provisional application claims priority under 35 U.S.C. § 119 (a) on Patent Application No(s). 202310648788.6 filed in China on Jun. 2, 2023, the entire contents of which are hereby incorporated by reference.

BACKGROUND

1. Technical Field

This disclosure relates to a sensing circuit with electromagnetic interference protection function.

2. Related Art

With the development of short video and cloud services, the requirements for data storage of the server has become increasingly high. In order to meet such requirements, manufacturers now choose to increase the frequency (clock speed) of the processor to reach higher performance, and the power consumption of the processor has naturally increased. Driven by such requirements, the system power consumption is getting higher, and the signal frequency is getting faster.

Under the trend of increasing processor power consumption, the design for high current has become a more favored choice. When a current flows through a wire, a circular magnetic field is formed around it. When a large current starts to change, a large magnetic field change is generated. A changing current generates a changing magnetic field, a changing magnetic field generates a changing electric field, and a changing electric field generates a changing magnetic field again. When the alternating electric field and magnetic field propagate outward, some sensitive electrical equipment nearby may be influenced to malfunction or have poor performance.

SUMMARY

Accordingly, this disclosure provides a sensing circuit with electromagnetic interference protection function.

According to one or more embodiment of this disclosure, a sensing circuit with electromagnetic interference protection function comprises a computing element and a sensing module. The computing element has a first terminal and a second terminal, and is configured to output a sensing result according to a voltage difference between the first terminal and the second terminal. The sensing module has a first connection point, a second connection point, a third connection point and a fourth connection point. The first connection point is electrically connected to the first terminal. The second connection point is electrically connected to the second terminal and is grounded through a first circuit. The third connection point is electrically connected to the first connection point and configured to receive an electrical signal. The fourth connection point is electrically connected to the second connection point and is grounded through a second circuit, wherein the first circuit is the same as the second circuit.

In view of the above description, the sensing circuit with electromagnetic interference protection function of the present disclosure may simply and effectively achieve an effect of electromagnetic interference protection by grounding the signal input terminal of the computing element and the grounding terminal of the sensing module in a same way. Compared with the implementation of additional electromagnetic shielding layers or shells, the sensing circuit of the present disclosure is not only easy to implement but also can avoid the situation that the shielding ability is insufficient and the electromagnetic interference problem cannot be solved from the root. And the sensing circuit that is electromagnetically sensitive can still maintain normal sensing and computing functions even if it is in a changing magnetic field environment full of high-frequency signals.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. According to the description, claims and the drawings disclosed in the specification, one skilled in the art may easily understand the concepts and features of the present invention. The following embodiments further illustrate various aspects of the present invention, but are not meant to limit the scope of the present invention.

Figure 1:
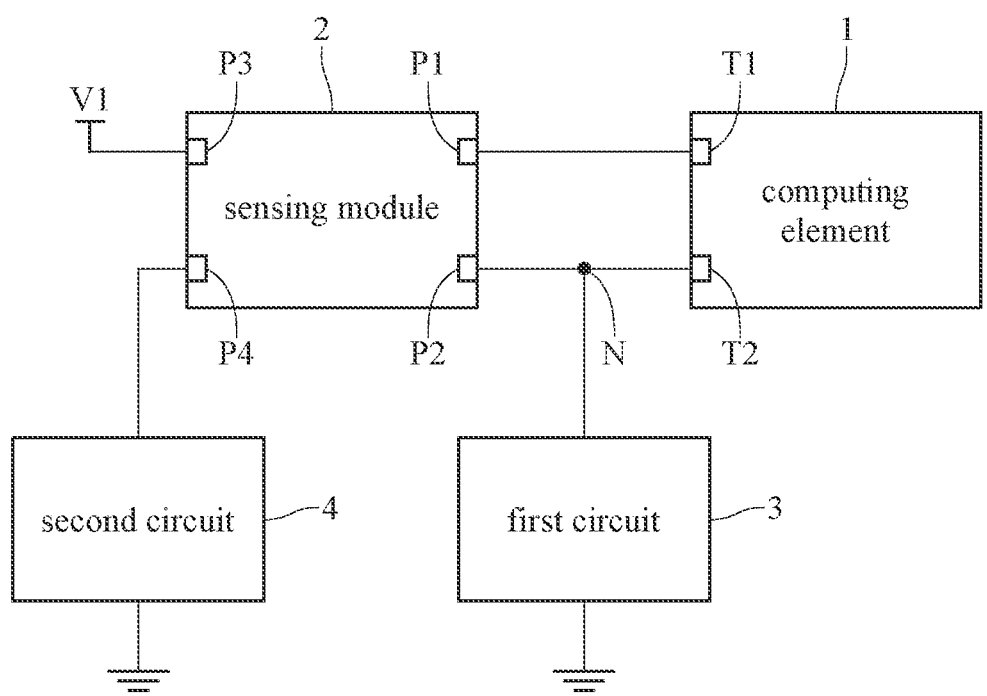
FIG. 1 schematically illustrates the sensing circuit with electromagnetic interference protection function according to an embodiment of the present invention.

Please refer to FIG. 1 which schematically illustrates the sensing circuit with electromagnetic interference protection function according to an embodiment of the present invention. As shown in FIG. 1, a sensing circuit 100 with electromagnetic interference protection function comprises a computing element 1, a sensing module 2, a first circuit 3 and a second circuit 4. The computing element 1 has a first terminal T1 and a second terminal T2, and is configured to output a sensing result according to a voltage difference between the first terminal T1 and the second terminal T2. The sensing module 2 has a first connection point P1, a second connection point P2, a third connection point P3 and a fourth connection point P4. The first connection point P1 is electrically connected to the first terminal T1. The second connection point P2 is electrically connected to the second terminal T2 and is grounded through the first circuit 3. The third connection point P3 is electrically connected to the first connection point P1 through internal circuit of the module and configured to receive an electrical signal V1. The fourth connection point P4 is electrically connected to the second connection point P2 through internal circuit of the module and is grounded through the second circuit 4, wherein the first circuit 3 is the same as the second circuit 4, and the first circuit 3 is connected to a node N between the second connection point P2 and the second terminal T2.

In the present embodiment, the computing element 1 can be implemented through an operational amplifier or a comparator, and is configured to generate a sensing result according to the voltage difference between the first terminal T1 and the second terminal T2. For example, when the voltage difference between the first terminal T1 and the second terminal T2 is higher than a predetermined value, the computing element 1 can output a first result, when the voltage difference between the first terminal T1 and the second terminal T2 is less than or equal to the predetermined value, the computing element 1 can output a second result different from the first result. The sensing module 2 may include at least one of a liquid leakage detection element, a voltage dependent resistor (VDR), a thermistor, a magnetic sensitive component, and a relay. One side of the sensing module 2 is configured to receive the electrical signal V1, and the other side is configured to be connected to the computing element 1.

In the present embodiment, the determination standard of the computing element 1 is related to the voltage value of the electrical signal V1. Specifically, the sensing module 2 can change to different states according to the sensed environmental changes. For example, in a first state of the sensing module 2, the voltage difference between the first connection point P1 and the second connection point P2 can be the same as the voltage difference between the third connection point P3 and the fourth connection point P4, that is, the electrical signal V1. Accordingly, the computing element 1 can detect that the sensing module is in the first state. Or, when the sensing module 2 is in a second state, the voltage difference between the first connection point P1 and the second connection point P2 can be different from the electrical signal V1, and the computing element 1 can detect the sensing module is in the second state. In the present embodiment, the first circuit 3 is the same as the second circuit 4, such as the same resistance element.

The sensing circuit 100 with electromagnetic interference protection function in the present embodiment may be disposed in an environment that is interfered with magnetic field while maintaining normal operation of the computing element 1 and the sensing module 2. For example, although the sensing module 2 is in a first state, the voltage difference between the first connection point P1 and the second connection point P2 is affected by the magnetic field and changes to be different from the electrical signal V1 due to its surrounding magnetic field interference. However, through the first circuit 3 disposed symmetrically with the second circuit 4, the voltage difference received by the computing element 1 through the first terminal T1 and the second terminal T2 will not be disturbed by the external magnetic field, so that the computing element 1 can successfully identify that the sensing module 2 is in the first state and avoid false-positive warning caused by magnetic field interference.

Based on the embodiment of the sensing circuit 100 shown in FIG. 1, other variations are described below. Each of the first circuit 3 and the second circuit 4 can be a wire, that is, the fourth connection point P4 of the sensing module 2 and the second terminal T2 of the computing element 1 can be directly grounded. In this way, even if the sensing module 2 is interfered by the surrounding magnetic field and generates voltage change within, the computing element 1 can accurately measure the voltage difference between the first terminal T1 and the second terminal T2. In addition, a distance between the node N and the computing element 1 may be smaller than a distance between the middle point of the second connection point P2 and the fourth connection point P4 and the node N. That is, in the present application, the closer to the computing element 1 is grounded, the more effectively the voltage change of the far-end sensing module due to magnetic field interference can be suppressed, and the occurrence of detection errors can be further reduced.

Figure 2:
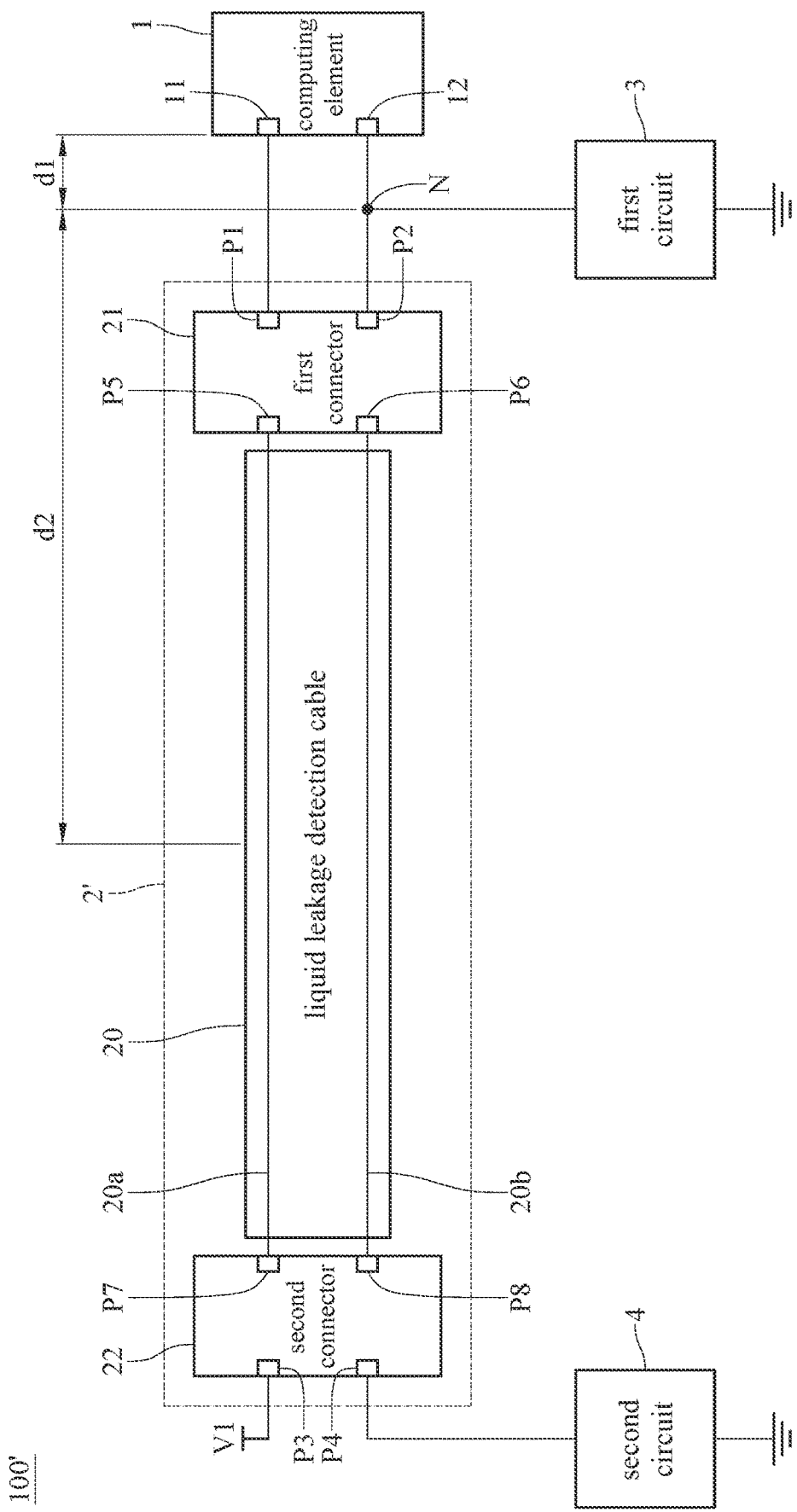
FIG. 2 schematically illustrates the sensing circuit with electromagnetic interference protection function according to another embodiment of the present invention.

Please refer to FIG. 2 which schematically illustrates the sensing circuit with electromagnetic interference protection function according to another embodiment of the present invention. As shown in FIG. 2, a sensing circuit 100' with electromagnetic interference protection function comprises a computing element 1, a sensing module 2', a first circuit 3 and a second circuit 4. The computing element 1 has a first terminal T1 and a second terminal T2, and configured to output a sensing result according to a voltage difference between the first terminal T1 and the second terminal T2. The sensing module 2' comprises a liquid leakage detection cable 20, a first connector 21 and a second connector 22. The first connector 21 has a first connection point P1, a second connection point P2, a fifth connection point P5, and a sixth connection point P6. The first connection point P1 is electrically connected to the fifth connection point P5 through an internal circuit. The connection point P2 is electrically connected to the sixth connection point P6 through an internal circuit. The liquid leakage detection cable 20 comprises a first detection line 20a and a second detection line 20b, wherein one end of the first detection line 20a is electrically connected to the fifth connection point P5, and one end of the second detection line 20b is electrically connected to the sixth connection point P6. The second connector 22 has a seventh connection point P7, an eighth connection point P8, the third connection point P3, and the fourth connection point P4. The third connection point P3 is electrically connected to the seventh connection point P7 through an internal circuit. The connection point P4 is electrically connected to the eighth connection point P8 through an internal circuit, wherein the seventh connection point P7 is electrically connected to another end of the first detection line 20a, and the eighth connection point P8 is electrically connected to another end of the second detection line 20b. The first connection point P1 is electrically connected to the first terminal T1, the second connection point P2 is electrically connected to the second terminal T2 and grounded through the first circuit 3, the third connection point P3 is electrically connected to the first connection point P1 through the first detection line 20a and is configured to receive an electrical signal V1, and the fourth connection point P4 is electrically connected to the second connection point P2 through the second detection line 20b and grounded through the second circuit 4, wherein the first circuit 3 is the same as the second circuit 4, and the first circuit 3 is connected to a node N between the second connection point P2 and the second terminal T2.

In the present embodiment, the computing element 1 can be implemented through an operational amplifier or a comparator. The sensing module 2' is composed of two connectors and a liquid leakage detection cable, wherein the first connector 21 and the second connector 22 can each be a connector applicable for signal transmission of a main board. Specifically, the sensing module 2' can be disposed adjacent to a processor on a main board, and is located in a magnetic field interference area formed by the high-frequency signal of the processor. The first circuit 3 is the same as the second circuit 4, such as the same resistor element. The sensing circuit 100' with electromagnetic interference protection function of the present embodiment is particularly related to a liquid leakage sensing circuit. The liquid leakage sensing circuit is disposed adjacent to a liquid cooling module to detect the occurrence of liquid leakage, and the liquid cooling module is disposed adjacent to a high-power consumption element for cooling operation. However, the liquid leakage detection cable of the liquid leakage sensing circuit is a sensitive device, which is easily disturbed by an external electromagnetic field.

Figure 3:
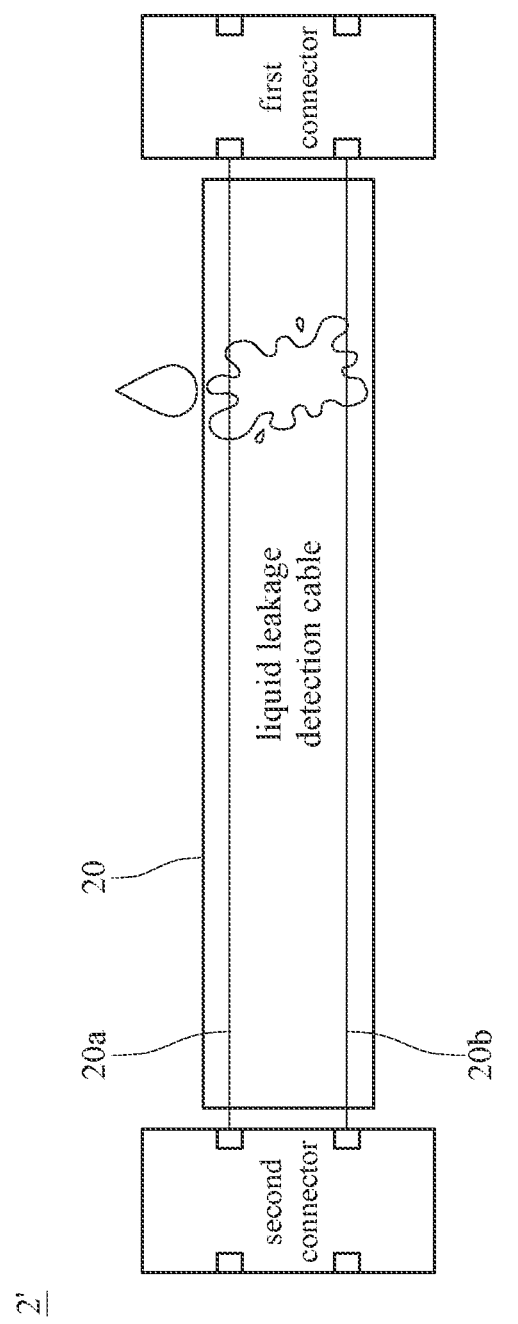
FIG. 3 schematically illustrates a detection state of the liquid leakage detection cable of the sensing circuit with electromagnetic interference protection function according to another embodiment of the present invention.

Please refer to FIG. 3 along with FIG. 2, FIG. 3 schematically illustrates a detection state of the liquid leakage detection cable of the sensing circuit with electromagnetic interference protection function according to another embodiment of the present invention. As shown in FIG. 3, the first detection line 20a and the second detection line 20b of the liquid leakage detection cable 20 of the sensing module 2' are wrapped by an absorbent material. Therefore, in a dry condition, the connection between the first detection line 20a and the second detection line 20b can be regarded as an open circuit. However, when the liquid leakage detection cable 20 is wetted, a short circuit may be formed between the first detection line 21 and the second detection line 22, thereby affecting the voltage value at the connection between the first connector and the computing element.

In the present embodiment, two ends of the liquid leakage detection cable 20 are respectively connected to the first connector 21 and the second connector 22 installed on the main board, and are disposed adjacent to a liquid pipeline of a liquid cooling module. In a normal condition where the liquid leakage detection cable 20 is dry (without liquid leakage), the computing element 1 can measure the voltage between the first terminal T1 and the second terminal T2 through the first connector 21, the liquid leakage detection cable 20 and the second connector 22, which is basically the same as the electrical signal V1. In a condition that the liquid leakage detection cable 20 is in contact with the liquid, due to the short circuit between the first detection line 20a and the second detection line 20b, the computing element 1 measures the voltage difference between the first terminal T1 and the second terminal T2 being less than the voltage of electrical signal V1. In a dry condition (without liquid leakage) and the liquid leakage detection cable 20 being disposed in an environment of magnetic field interference, interference signals may occur between the first detection line 20a and the second detection line 20b. However, by grounding a point close to the computing element 1 between the second terminal T2 of the computing element 1 and the second connection point P2, the computing element 1 can measure the voltage difference between the first terminal T1 and the second terminal T2 being the same as the electrical signal V1 to determine that there is no liquid leakage without being disturbed by the environmental magnetic field.

In the present embodiment, the length of the liquid leakage detection cable 20 could be tens of centimeters to several meters. A distance d1 between the node N that is grounded between the second terminal 12 and the second connection point P2 and the computing element 1 is smaller than a distance d2 between a middle point of the second connection point P2 and the fourth connection point P4 and the node N, wherein the distances d1 and d2 can refer to the path length of the relevant electrical signal and are not limited to the linear distance between two points. Through the near-point grounding circuit configuration in the present embodiment, the influence of environmental magnetic field change on the measurement of the computing element 1 can be effectively reduced, the accuracy can be improved and the false-positive warning rate can be reduced. The present invention is applicable for other sensitive devices subject to electromagnetic interference (such as voltage dependent resistors, thermistors, magnetic sensitive components, etc.) and relays, etc. In layout and electronic design, electromagnetic interference should be considered, and the logic operator can be protected from electromagnetic interference as in the foregoing embodiment.

Preferably, the J27 series connector on the market can be chosen as the above-mentioned first connector 21 as the connection between the liquid leakage detection cable 20 and the signal source, and the J41 series connector on the market can be chosen as the second connector 22 as the connection between the liquid leakage detection cable 20 and the computing element 1. The electrical signal V1 can be a voltage signal of 3 volts. The U29 series comparators on the market can be chosen as the computing element 1. The connector of the above-mentioned specific type is applicable for the main board, the liquid leakage detection cable and the liquid cooling module, and the above-mentioned comparator is applicable for measuring according to an electrical signal (such as 3 volts) applied to one end of the first connector 21, to determine whether the liquid leakage detection cable 20 is in contact with liquid.

In view of the above description, the sensing circuit with electromagnetic interference protection function of the present disclosure may simply and effectively achieve an effect of electromagnetic interference protection by grounding the signal input terminal of the computing element and the grounding terminal of the sensing module in a same way. Compared with the implementation of additional electromagnetic shielding layers or shells, the sensing circuit of the present disclosure is not only easy to implement but also can avoid the situation that the shielding ability is insufficient and the electromagnetic interference problem cannot be solved from the root. And the sensing circuit that is electromagnetically sensitive can still maintain normal sensing and computing functions even if it is in a changing magnetic field environment full of high-frequency signals. In addition, the sensing circuit of the present invention can effectively reduce the impact of changes in the environmental magnetic field on the measurement of computing element through a circuit configuration of grounding at a position close to the computing element, thereby improving accuracy and reducing false-positive warning rates. The present invention can be applied to various sensitive devices (such as liquid leakage detection components, voltage dependent resistor, thermistors, magnetic sensitive components, etc.) susceptible to electromagnetic interference and relays.

What is claimed is:

1. A sensing circuit with electromagnetic interference protection function, comprising:
   a computing element having a first terminal and a second terminal, and configured to output a sensing result according to a voltage difference between the first terminal and the second terminal; and
   a sensing module having a first connection point, a second connection point, a third connection point and a fourth connection point, the first connection point electrically connected to the first terminal, the second connection point electrically connected to the second terminal and grounded through a first circuit, the third connection point electrically connected to the first connection point and configured to receive an electrical signal, the fourth connection point electrically connected to the second connection point and grounded through a second circuit, wherein the first circuit is the same as the second circuit, and the first circuit is connected to a node between the second connection point and the second terminal.

2. The sensing circuit with electromagnetic interference protection function of claim 1, wherein the sensing module comprises:
- a first connector having the first connection point, the second connection point, a fifth connection point, and a sixth connection point, the first connection point electrically connected to the fifth connection point, the second connection point electrically connected to the sixth connection point;
- a liquid leakage detection cable comprising a first detection line and a second detection line, one end of the first detection line electrically connected to the fifth connection point, and one end of the second detection line electrically connected to the sixth connection point;
- a second connector having a seventh connection point, an eighth connection point, the third connection point, and the fourth connection point, the seventh connection point electrically connected to another end of the first detection line, and the eighth connection point is electrically connected to another end of the second detection line.

3. The sensing circuit with electromagnetic interference protection function of claim 2, wherein the first connector and the second connector each is a connector applicable for signal transmission of a main board.

4. The sensing circuit with electromagnetic interference protection function of claim 2, wherein the sensing module is disposed adjacent to a processor on a main board, and is located in a magnetic field interference area formed by a high-frequency signal of the processor.

5. The sensing circuit with electromagnetic interference protection function of claim 1, wherein each of the first circuit and the second circuit is a wire.

6. The sensing circuit with electromagnetic interference protection function of claim 1, wherein the computing element is a comparator.

7. The sensing circuit with electromagnetic interference protection function of claim 1, wherein a distance between the node and the computing element is smaller than a distance between a middle point of the second connection point and the fourth connection point and the node.

8. The sensing circuit with electromagnetic interference protection function of claim 1, wherein the sensing module comprises at least one of a voltage dependent resistor, a thermistor, a magnetic sensitive component, and a relay.

* * * * *